US012796049B2

(12) United States Patent
Venkatraman et al.

(10) Patent No.: US 12,796,049 B2
(45) Date of Patent: Nov. 10, 2026

(54) SHIELD CONTACT LAYOUT FOR POWER MOSFETS

(71) Applicant: SEMICONDUCTOR COMPONENTS INDUSTRIES, LLC, Phoenix, AZ (US)

(72) Inventors: Prasad Venkatraman, Gilbert, AZ (US); Peter Burke, Portland, OR (US); Gary Horst Loechelt, Tempe, AZ (US); Balaji Padmanabhan, Chandler, AZ (US); Emily M. Linehan, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 969 days.

(21) Appl. No.: 17/655,579

(22) Filed: Mar. 21, 2022

(65) Prior Publication Data

US 2022/0310802 A1 Sep. 29, 2022

Related U.S. Application Data

(60) Provisional application No. 63/166,242, filed on Mar. 26, 2021.

(51) Int. Cl.
*H10D 64/00* (2025.01)
*H10D 64/01* (2025.01)
*H10D 64/27* (2025.01)

(52) U.S. Cl.
CPC ........... *H10D 64/117* (2025.01); *H10D 64/01* (2025.01); *H10D 64/513* (2025.01)

(58) Field of Classification Search
CPC .... H10D 64/117; H10D 64/01; H10D 30/668; H10D 30/0297; H10D 64/513;
(Continued)

(56) References Cited

U.S. PATENT DOCUMENTS 9,570,605 B1 2/2017 Peake
9,793,387 B2 10/2017 Hutzler et al.
(Continued)

FOREIGN PATENT DOCUMENTS

CN 106601811 A 4/2017
CN 109065454 A 12/2018
(Continued)

OTHER PUBLICATIONS

International Searching Authority, "Notification of Transmittal of the International Search Report and the Written Opinion of the International Searching Authority, or the Declaration," Jul. 14, 2022.

(Continued)

*Primary Examiner* — Matthew C Landau
*Assistant Examiner* — Vincent Kipkemoi Rono
(74) *Attorney, Agent, or Firm* — Brake Hughes Bellermann LLP

(57) ABSTRACT

A method includes defining a plurality of trenches of a first type that extend in a longitudinal direction in a semiconductor substrate, and defining a trench of a second type extending in a lateral direction and intersecting the plurality of trenches of the first type. The trench of the second type is in fluid communication with each of the intersected plurality of trenches of the first type. The method further includes disposing a shield poly layer in the plurality of trenches of the first type and the trench of the second type, disposing an inter-poly dielectric layer and a gate poly layer above the shield poly layer in the plurality of trenches of the first type and the trench of the second type, and forming an electrical contact to the shield poly layer through an opening in the inter-poly dielectric layer and the gate poly layer disposed in the trench of the second type.

23 Claims, 11 Drawing Sheets

200

(58) Field of Classification Search
CPC ............. H10D 12/481; H10D 30/0245; H10D 62/605; H10D 1/041; H10D 44/466
See application file for complete search history.

(56) References Cited

U.S. PATENT DOCUMENTS

2006/0273385 A1 12/2006 Hshieh
2008/0035988 A1 2/2008 Hshieh
2009/0008706 A1 1/2009 Yedinak et al.
2009/0008709 A1* 1/2009 Yedinak ............... H10D 12/038 257/E29.264
2010/0123188 A1 5/2010 Venkatraman
2011/0039383 A1 2/2011 Chen et al.
2011/0068386 A1 3/2011 Tai et al.
2011/0220990 A1 9/2011 Chang et al.
2012/0061753 A1* 3/2012 Nishiwaki .......... H10D 30/0297 257/E29.264
2013/0328122 A1 12/2013 Li et al.
2014/0048869 A1 2/2014 Yedinak et al.
2017/0373186 A1* 12/2017 Chen .................. H10D 30/0293
2018/0269293 A1 9/2018 Yilmaz et al.
2020/0083366 A1* 3/2020 Venkatraman ..... H10D 30/0297
2020/0395468 A1 12/2020 Probst et al.

FOREIGN PATENT DOCUMENTS

CN 110890327 A 3/2020
JP 2012059943 A 3/2012
JP 2017188590 A 10/2017
JP 2018164081 A 10/2018
JP 2020077727 A 5/2020
TW 201822295 A 6/2018

OTHER PUBLICATIONS

Office Action for Korean Application No. 10-2023-7033363, mailed Aug. 20, 2025, 15 pages (w/ full English translation).
Office Action for Taiwanese Application No. 111111248, mailed Aug. 28, 2025, 22 pages (w/ full English translation).
Office Action for Japanese Application No. 2023-558958, dated Mar. 31, 2026, 8 pages (w/full English translation).

* cited by examiner

200

SHIELD CONTACT LAYOUT FOR POWER MOSFETS

CROSS-REFERENCE TO RELATED APPLICATION

This application claims priority to, and the benefit of, U.S. Provisional Patent Application No. 63/166,242, filed on Mar. 26, 2021, which is incorporated by reference in its entirety herein.

TECHNICAL FIELD

This description relates to contacts in a shielded gate trench MOSFET.

BACKGROUND

Buried polysilicon shield electrodes are used in shielded gate trench MOSFETs for charge balancing and reducing the drain-source on resistance ($RDS_{on}$) of the devices. However, the resistance and stray capacitances associated with the polysilicon shield electrodes can affect electrical performance of the device, for example, by causing undesirable gate bounce or low avalanche capability during unclamped inductive switching (UIS) in device circuits, or otherwise affect application efficiency. As semiconductor device (e.g., device cell dimensions) and lithography design rules shrink, it is increasingly difficult to make low resistance buried polysilicon shield electrodes in a semiconductor device (e.g., a shielded gate trench MOSFET) to avoid or reduce, for example, gate bounce and poor avalanche capability.

SUMMARY

In a general aspect, a device includes a plurality of trenches of a first direction type extending in a longitudinal direction in a semiconductor substrate, and a trench of a second direction type extending in a transverse direction and intersecting the plurality of trenches of the first direction type. The longitudinal direction is orthogonal to the transverse direction. The trench of the second direction type is in fluid communication with each of the intersected plurality of trenches of the first direction type.

The device further includes a shield poly layer disposed in the plurality of trenches of the first direction type and the trench of the second direction type, an inter-poly dielectric layer (IPL) and a gate poly layer disposed above the shield poly layer in the plurality of trenches of the first direction type and the trench of the second direction type, and an electrical contact to the shield poly layer disposed within an opening in the inter-poly dielectric layer and the gate poly layer disposed in the trench of the second direction type.

In a general aspect, a device includes a plurality of longitudinal trenches and longitudinal mesas of a first direction type extending in parallel in a longitudinal direction across a semiconductor substrate, and a lateral trench of a second direction type extending in a transverse direction orthogonal to the longitudinal direction and perpendicularly intersecting the plurality of longitudinal trenches and longitudinal mesas of the first direction type. The lateral trench is in fluid communication with the plurality of longitudinal trenches of the first direction type. The lateral trench splits each of the plurality of longitudinal trenches and longitudinal mesas into a first section longitudinal trench and a first section mesa on a first side of the lateral trench, and a second section longitudinal trench and a second section longitudinal mesa on a second side opposite the first side of the lateral trench, The lateral trench is in fluid communication with each of the plurality of first section longitudinal trenches and second section longitudinal trenches.

The device further includes a shield poly layer disposed in the plurality of longitudinal trenches and the lateral trench, an inter-poly dielectric layer (IPL) and a gate poly layer disposed above the shield poly layer in the plurality of longitudinal trenches and the lateral trench, and an electrical contact to the shield poly layer by at least one insulator-lined conductive-plug extending through the inter-poly dielectric layer and the gate poly layer disposed in the lateral trench.

In a general aspect, a method includes defining a plurality of trenches of a first type in a semiconductor substrate. The plurality of trenches of the first type extend in a longitudinal direction. The method further includes defining a trench of a second type extending in a lateral direction and intersecting the plurality of trenches of the first type. The trench of the second type being in fluid communication with each of the intersected plurality of trenches of the first type. The method further includes disposing a shield poly layer in the plurality of trenches of the first type and the trench of the second type, disposing an inter-poly dielectric layer (IPD) and a gate poly layer above the shield poly layer in the plurality of trenches of the first type and the trench of the second type, and forming an electrical contact to the shield poly layer through an opening in the inter-poly dielectric layer and the gate poly layer disposed in the trench of the second type.

DESCRIPTION

Figure 1:
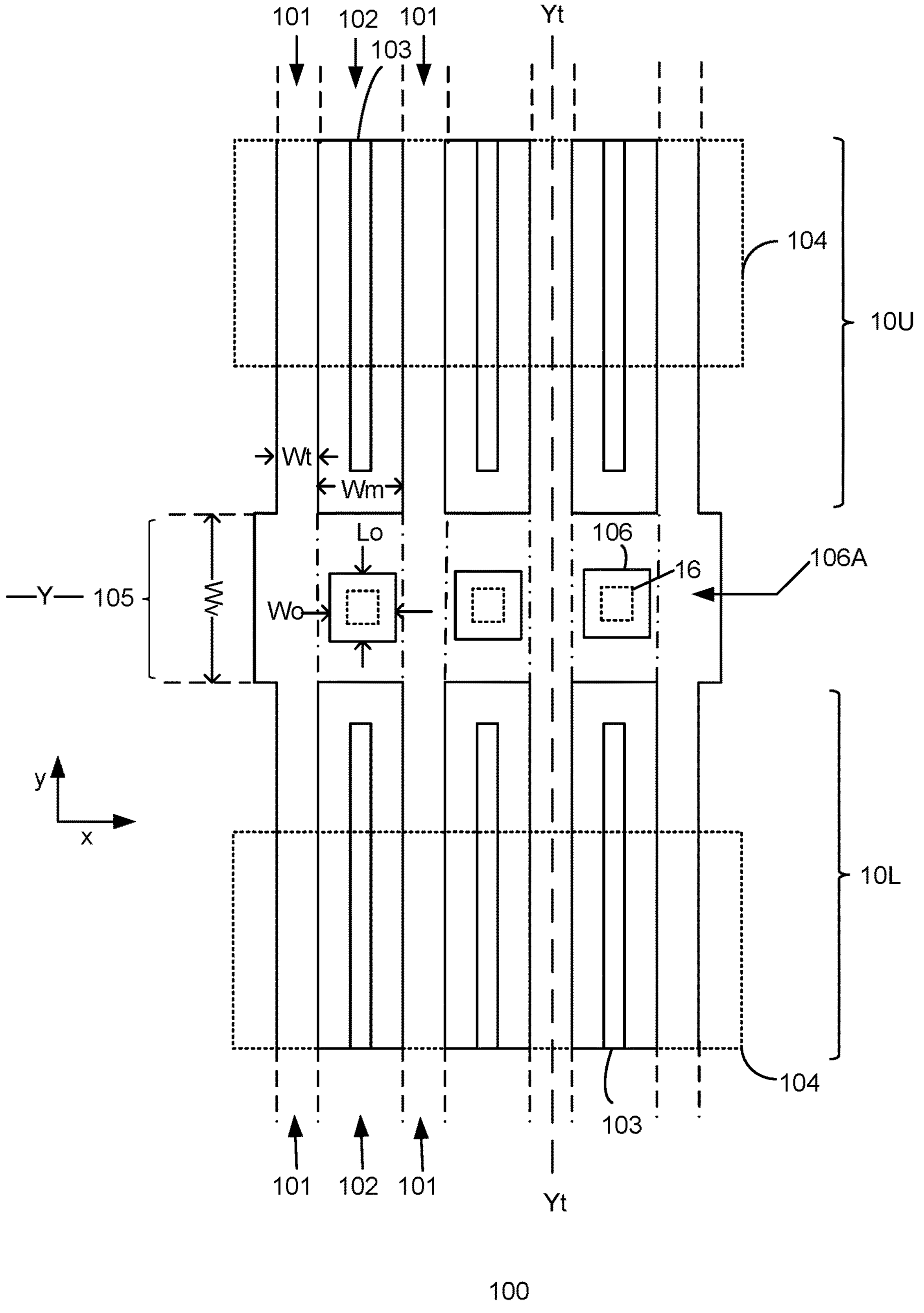
FIG. 1 illustrates a portion of an example device mask layout.

Metal oxide semiconductor field effect transistor (MOSFET) devices are used in many power switching applications. In a typical MOSFET device, a gate electrode provides turn-on and turn-off control of the device in response to an applied gate voltage. For example, in an N-type enhancement mode MOSFET, turn-on occurs when a conductive N-type inversion layer (i.e., channel region) is formed in a p-type body region in response to a positive gate voltage, which exceeds an inherent threshold voltage. The inversion layer connects N-type source regions to N-type drain regions and allows for majority carrier conduction between these regions.

In a trench MOSFET device, a gate electrode is formed in a trench that extends downward (e.g., vertically downward) from a major surface of a semiconductor material (also can be referred to as a semiconductor region) such as silicon. Further, a shield electrode may be formed below the gate electrode in the trench (and insulated via an inter-electrode or inter-poly dielectric). Current flow in a trench MOSFET device is primarily vertical (e.g., in an N doped drift region) and, as a result, device cells can be more densely packed. A device cell may, for example, include a trench that contains the gate electrode and the shield electrode, and an adjoining mesa that contains the drain, source, body, and channel regions of the device.

A current handling capability of a trench MOSFET device is determined by its gate channel width. To minimize cost it may be important to keep the transistor's die area size as small as possible and increase the width of the channel surface area (i.e., increase the "channel density") by creating cellular structures repeated over the whole area of a MOSFET die. A way to increase the channel density (and therefore increase channel width) is to reduce the size of the device cell and pack more device cells at a smaller pitch in a given surface area.

An example trench MOSFET device may include an array of hundreds or thousands of device cells (each including a trench and an adjoining mesa). A device cell may be referred to herein as a trench-mesa cell because each device cell geometrically includes a trench and a mesa (or two half mesas) structures. Shield and gate electrodes may be formed inside of a linear trench (e.g., trench 101) running along (e.g., aligned along) a mesa (e.g., mesa 102). The shield and gate electrodes may be made of polysilicon (e.g., "n+ shield poly silicon" and "n+ gate poly silicon") and isolated from each other by a dielectric layer (e.g., an inter-poly dielectric (IPD) layer 112, FIG. 2B). The IPD layer may, for example, be an oxide layer. The shield and gate electrodes are also isolated from silicon in the mesa by dielectric layers (e.g., shield dielectric and gate dielectric layers).

To ensure proper electrical contact of every cell, a "planar stripe" structure is often used for trench MOSFETS fabricated on a semiconductor die surface. In the planar stripe structure, a gate electrode ("gate") and a shield electrode ("shield poly") within a trench (e.g., a linear trench) are disposed to run along (e.g., aligned along) a length of the trench in a longitudinal stripe. Trenches that include the gate electrode and the shield electrode can be referred to as active trenches, The gate electrode (e.g., made with gate poly) is disposed along the length of the active trench on top of (or above) the shield electrode (e.g., made with shield poly). The gate poly in the active trench is exposed and contacted at a stripe end by a gate runner (e.g., gate metal) and the shield electrode (shield poly) in the trench can be exposed and brought up to the surface (using a masking step) at an location along the length of the active trench for contact by a source metal.

In modern trench MOSFET devices (e.g., with narrow line widths) shield resistance is a factor affecting device efficiency and performance. Lower shield resistance can be obtained by making multiple contacts to the shield poly in an active trench (e.g., by bringing the shield poly vertically up to the surface through gate poly at multiple locations to make multiple shield contacts with source metal).

Bringing the shield poly up vertically to the surface (from directly below the gate poly) interrupts or breaks the continuity of the gate poly running along the length of the active trench. The gate poly is broken into two discontinuous segments along the length of the active trench by each instance of the shield poly brought up vertically to the surface. In example implementations, two separate gate runners or gate metal strips (e.g., gate metal 710-1, 710-2 shown in, for example, FIGS. 6 and 7) at ends of the stripe may be required to contact the two discontinued gate poly segments created by a single instance of the shield poly being brought vertically up through the active trench to the surface. Multiple instances of the shield poly being brought vertically up through the gate poly to the surface along a length of the active trench can result in several isolated gate poly segments that are floating (i.e., not connected by the two separate gate runners), and hence require multiple gate runners to contact each gate poly segment, which takes up die area.

The disclosure herein describes example device configurations or layouts for making contacts to shield electrodes buried underneath gate electrodes in active trenches of a MOSFET device fabricated in a semiconductor substrate. A contact (e.g., a metal, metal alloy, metal silicide, conductive poly, or other conductive material contact) is made to shield poly buried underneath gate poly in a shield-connection trench perpendicular to and traversing the active trenches. The shield connection trench may be a trench portion to the side of an active trench. The contact is made through a vertical insulator-lined (e.g., oxide-lined) opening extending from a top surface through gate poly (and other dielectrics e.g., interlayer dielectrics) overlaying the shield electrode to reach the buried shield poly. The buried shield poly is left in place underneath the gate poly and not brought up to the surface. Instead, the contact to the shield poly is made by depositing conductive material (e.g., a metal, tungsten) in the opening. The gate poly is routed in a horizontal plane around the opening in the shield-connection trench to preserve continuity of the gate electrode in a portion of an active trench on one side of the contact and a corresponding portion of the active trench on an opposite side of the contact.

FIG. 1 shows a portion of an example device mask layout 100 of a shielded gate trench MOSFET device (e.g., device 200, FIGS. 2A, 2B, and 2C) in which multiple contacts can be made to a shield electrode in the device. FIG. 1 shows device mask layout 100, for example, in an x-y plane (the x-y plane can be aligned along a plane of a silicon wafer or semiconductor substrate of a transistor device).

For convenience in description, the relative orientations or coordinates of features (e.g., trenches 101 and 105, mesa 102, etc.) of the disclosed trench MOSFET devices may be described herein with reference to the x axis and y axis shown, for example, on the page of FIG. 1. The direction perpendicular to the x-y plane of the page (e.g., the z axis) may be referred to as the vertical direction or axis. The z direction can be a direction downward into a depth of the semiconductor substrate and can be aligned in a direction of, for example, a depth of a trench in a MOSFET device fabricated in the semiconductor substrate. Further, for visual clarity, a limited number of trenches/device cells (e.g., 3-5 trenches/device cells) of the arrays of trenches/device cells in device mask layout 100 are shown in FIG. 1. As previously noted, an actual MOSFET device may include arrays of hundreds or thousands of trenches/device cells, which may be obtained, for example, by repeating (e.g., in the x direction) the limited array structures shown in example device mask layout 100.

Device mask layout 100, as shown in FIG. 1, includes a number of active trenches (i.e. longitudinal trenches 101) of the device running parallel (e.g., substantially parallel) to each other (e.g., in a y direction). Mesas 102 may be formed between pairs of the longitudinal trenches 101. Trenches 101 and mesas 102 may be linear trenches and linear mesas (running, for example, in the y direction), respectively. Trenches 101 and mesa 102 may have uniform widths Wt and Wm (e.g., horizontal widths in the x direction), respectively. Device elements (e.g., source and body regions (not shown)) may be formed in mesas 102 and contacted, for example, by source metal (not shown) at source contact regions 103. The device elements (e.g., the source and body regions) may be formed, for example, by n-type source and drain (NSD) implants in sections 104 of device mask layout 100.

While only a few trenches 101 and mesas 102 (e.g., four trenches and three mesas) are shown in FIG. 1 (and other figures herein) it is noted that an actual MOSFET device may include arrays of hundreds or thousands of trenches/device cells, which may be obtained, for example, by repeating (e.g., in the x direction) the trench and mesa structures or patterns shown in the figures.

A horizontal or lateral trench (e.g., shield-connection trench 105) (side trench) may extend laterally (e.g., in a x direction) to intercept and traverse (i.e., cut across) trenches 101 and mesas 102 at a distance Y along the y axis. Shield-connection trench 105 may, for example, have a vertical width Wv in the y direction. Shield-connection trench 105 may effectively split each longitudinal trench 101 and each mesa 102 into two sections (e.g., with an upper section of a longitudinal trench 101 in an upper area (e.g., area 10U) of device mask layout 100 above shield-connection trench 105 in the y direction, and a lower section of trench 101 in a lower area (e.g., area 10L) of device mask layout 100 below shield-connection trench 105 in the y direction). The trenches (i.e. trenches 101 and trench 105) may have about a same depth (not shown) referenced, for example, from a top surface of mesa 102.

In example implementations, the two sections of the longitudinal trenches 101 (i.e., the upper section of a longitudinal trench 101 in an upper area 10U, and the lower section of corresponding trench 101 in a lower area 10L) on either side (i.e., above and below) shield-connection trench 105 may be aligned in the horizontal x direction (i.e., share or lie on a common y axis Yt as illustrated in FIG. 1 for the second most vertical trench from the right of the page).

Shield-connection trench 105 may be in fluid communication with each of the split sections of trenches 101 (in other words, shield-connection trench 105 has physical openings to each of the split sections of trenches 101 such that a fluid (i.e., a gas or liquid of no fixed shape) can flow easily through the openings from shield-connection trench 105 into each of the split sections of trenches 101, or vice versa). Shield electrodes and gate electrodes (not shown) of the device may be formed in trenches 101, for example, by deposition of shield poly and gate poly in the trenches 101 and 105. The shield poly and gate poly may be separated by an inter-poly dielectric (IPD) layer (not shown in FIG. 1).

Figure 2A:
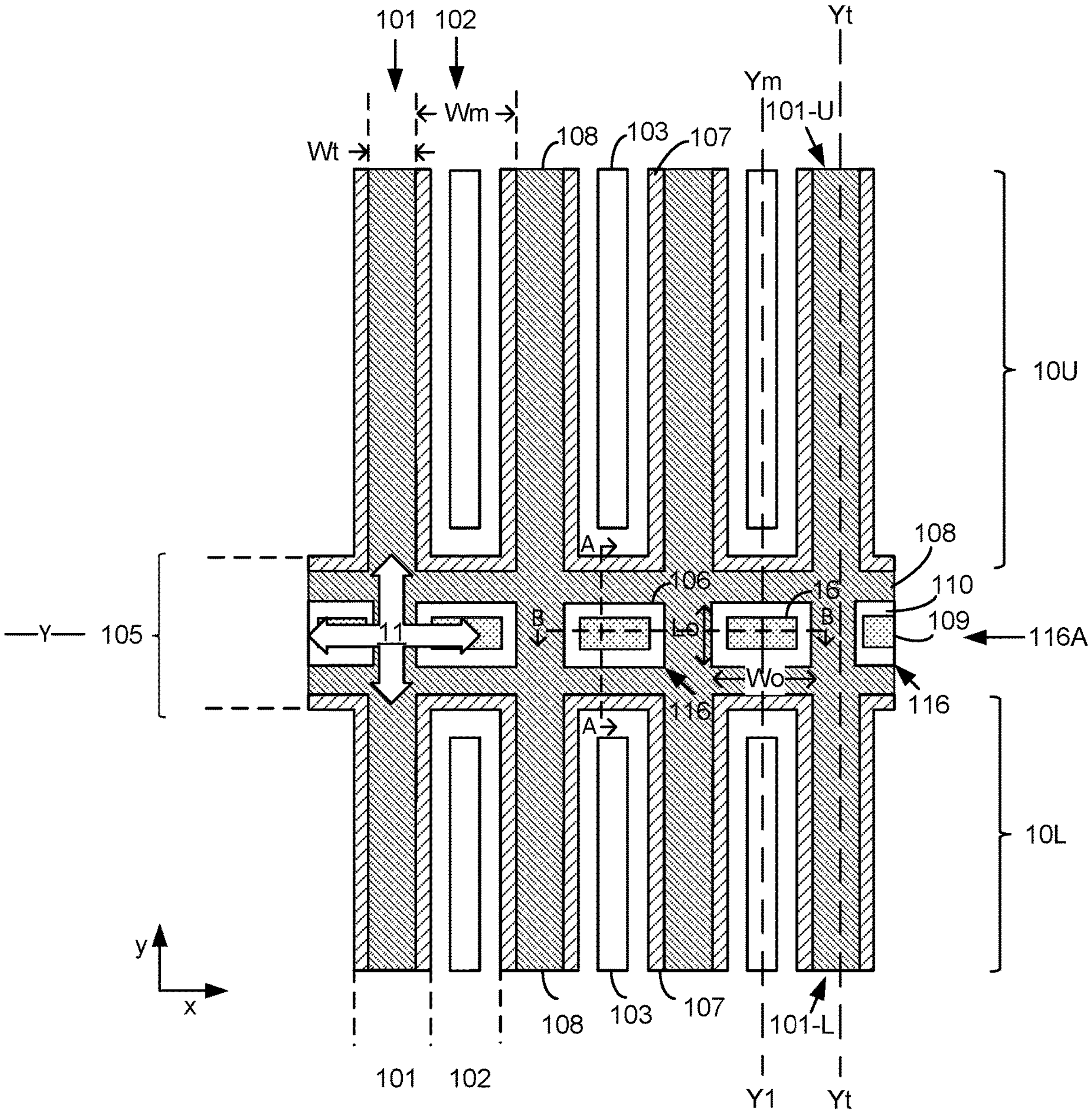
FIG. 2A illustrates a portion of an example shielded gate trench MOSFET device.

The shield poly in shield-connection trench 105 can be exposed (for making contact to the shield electrodes in trenches 101 and 105 through one or more openings (e.g., opening 106) made from a top surface of the gate poly through the gate poly and IPD layers in shield-connection trench 105 to reach the underlying shield poly. In example implementations, an insulator-lined conductive plug (e.g., an insulator-lined conductive plug 116 shown in at least FIGS. 2A, 2B, and 2C) may be fabricated in opening 106. An insulator-lined conductive-plug 116 may, for example, include a conductive central portion made of conductive material 109 (FIG. 2A) surrounded by a concentric insulating outer portion (made of oxide 110 (FIG. 2A).

In example implementations, with renewed reference to device mask layout 100 (FIG. 1), opening 106 may be first filled with an oxide (e.g., oxide 110, FIG. 2A) or other insulator and then another opening may be made through the oxide or other insulator fill to form an insulator-lined opening (e.g., opening 16) to again reach the underlying shield poly. In the device mask layout 100 shown in FIG. 1, this another insulator-lined opening (i.e., opening 16) is shown as a rectangle in a dashed line format inside opening 106.

Metal or other conductive material (e.g., conductive material 109, FIG. 2A) may be deposited in oxide-lined opening 16 to establish electrical contact with the underlying shield poly for connection with, for example, a source metal of the device (e.g., source metal 720, FIGS. 6 through 9).

In example implementations, gate poly deposited in shield-connection trench 105 along a side of, or around, an insulator-lined conductive-plug 116 formed in an opening 106 may provide structural and electrical continuity of the gate electrodes in trenches 101 across shield-connection trench 105 (in other words, gate poly in the sections of trenches 101 in upper area 10U is continuous with gate poly in the corresponding sections of trenches 101 in lower area 10U).

In example implementations, openings 106 and 16 (and insulator-lined conductive-plug(s) 116) may have a square shape, a rectangular shape, a circular shape, an oval shape, or any other shape in the x-y plane. In example implementations, as shown in FIG. 1, openings 106 may have a rectangular shape with, for example, a width Wo in the x direction and a length Lo in the y direction. In example implementations, width Wo may be larger than, the same as, or smaller than width Wm of mesas 102.

In example implementations, for MOSFETs with a breakdown voltage BVDSS of 25V to 30V, trench 101 may have a width Wt, for example, in a range of about 0.2 μm to 1.0 μm (e.g., 0.3 μm); mesa 102 may have a width Wm, for example in a range of about 0.2 μm to 1.0 μm (e.g., 0.3 μm); shield contact trench 105 may have a width Wv, for example, in a range of about 0.5 μm to 2.0 μm (e.g., 1.0 μm); insulator lined conductive plug 116 may have a width Wo in a range of about 0.3 μm to 2.0 μm (e.g., 1.4 μm) and a length Lo in a range of about 0.3 μm to 1.2 μm (e.g., 0.6 μm); and contact opening 16 may have a width in the x-direction in a range of about 0.1 μm to 1.8 μm (e.g., 1.0 μm) and length in the y-direction of about 0.1 μm to 1.0 μm (e.g., 0.2 μm).

For MOSFETs with a breakdown voltage BVDSS higher than 30V, the dimensions of the foregoing features (e.g., trench 101 width Wt, mesa 102 width Wm, shield contact trench 105 width Wv, insulator lined conductive plug 116 width Wo and length Lo, and contact opening 16 width and length) may be larger than the example numbers given above for MOSFETs with a breakdown voltage BVDSS of 25V to 30V.

In an example implementation, an array (e.g., array 106A) of a number of openings 106 may be disposed along the x-axis in shield-connection trench 105 to form a corresponding array 116A of insulator-lined conductive-plug(s) 116) (FIG. 2A).

In example implementations, as shown in FIG. 2A, an insulator-lined conductive-plug 116 in shield-connection trench 105 may be aligned in the y direction with mesa 102 of upper area 10U and a corresponding mesa 102 of lower area 10L (in other words, each insulator-lined conductive-plug 116, a mesa 102 of upper area 10U, and corresponding mesa 102 of lower area 10L may all lie along a common axis (e.g., axis Ym, FIG. 2A) in the y direction.

FIG. 2A shows an example shielded gate trench MOSFET device 200 with gate electrodes that are continuous around and are not interrupted (i.e., uninterrupted) by the shield contacts made to shield poly under the gate electrodes. In example implementations, device 200 may be fabricated using, for example, device mask layout 100. In the example shown in FIG. 2A, device 200 includes active trenches 101 and mesas 102 running in the y direction and a horizontal shield-connection trench 105 (side trench) extending laterally (e.g., in a x direction) across trenches 101 and mesas 102. Corresponding sections of active trenches 101 (and mesas 102) extending in the y direction above and below horizontal shield-connection trench 105 may be aligned with each other in the x direction (in other words a section of trench 101 above and a section of a corresponding trench 101 below may share a common y axis (e.g., axis Yt) and not be staggered relative to each other in the x direction). FIG. 2A shows, for example, a section 101-U of a trench 101 above and a section 101-L of a corresponding trench 101 below horizontal shield-connection trench 105 that are aligned on a common y axis (i.e., Yt). Similarly, neighboring sections of a mesa 102 above and below horizontal shield-connection trench 105 are aligned on a common y axis (i.e., Ym).

In example implementations, gate poly deposited in shield-connection trench 105 along a side of, or around, an insulator-lined conductive-plug 116 may provide structural and electrical continuity of the gate electrodes in trenches 101 across shield-connection trench 105 (in other words, gate poly in the section of a trench 101 in upper area 10U is continuous with gate poly in the corresponding section of a trench 101 in lower area 10U through shield-connection trench 105).

A gate oxide 107 may be grown or deposited on sidewalls of mesas 102 bordering active trenches 101 and shield-connection trench 105. A layer of gate poly 108 may be deposited in active trenches 101 and shield-connection trench 105 to form a gate electrode above a layer of shield poly (shield poly layer 111, FIG. 2B) and an inter-poly dielectric (IPD) layer 112 (IPD layer 112, FIG. 2B) previously deposited in the trenches. The layer of shield poly and the IPD layer are not visible in FIG. 2A because they are buried under gate poly 108.

In device 200, the buried shield poly layer is contacted by an array (e.g., array 116A) of vertical insulator-lined conductive-plugs 116 made through the layers of gate poly 108 and IPD 112 in shield-connection trench 105. Each insulator-lined conductive-plug 116 may include a conductive central portion surrounded by insulating liner. In example implementations, the insulating liner may be made of an insulating material such as an oxide 110, and the conductive central portion may be made of a conductive material 109 (e.g., tungsten). The conductive material 109 (e.g., tungsten) of each insulator-lined conductive-plug may electrically contact the shield poly buried under gate poly 108 and IPD layer 112 in device 200. Gate poly 108 along and around the vertical insulator-lined conductive-plugs 116 can maintain electrical continuity of the gate electrodes formed in active trenches 101 across shield-connection trench 105.

An electrical contact to the buried shield poly layer is made by at least one insulator-lined conductive-plug 116 passing through the inter-poly dielectric layer 112 and the gate poly layer 108 disposed in a shield-connection trench 105 to reach the buried shield poly layer.

In example implementations, a number of vertical insulator-lined conductive-plugs 116 in shield-connection trench 105 may be equal to (or about equal) to the number of active trenches 101 (or mesas 102) intersected by shield-connection trench 105. Further, in example implementations, as shown in FIG. 2A, each insulator-lined conductive-plugs 116 may be disposed in a space between a section of a mesa 102 in an upper area 10A and a corresponding section of a mesa 102 in a lower area 10L. Each insulator-lined conductive-plug 116 may have a rectangular shape with a width Wo in the x direction and a length Lo in the y direction. In example implementations, as previously noted, width Wo may be larger than, the same as, or smaller than width Wm of mesas 102. In the example implementation shown, for example, in FIG. 2A, width Wo may be about two to three times as large as length Lo.

Figure 2B:
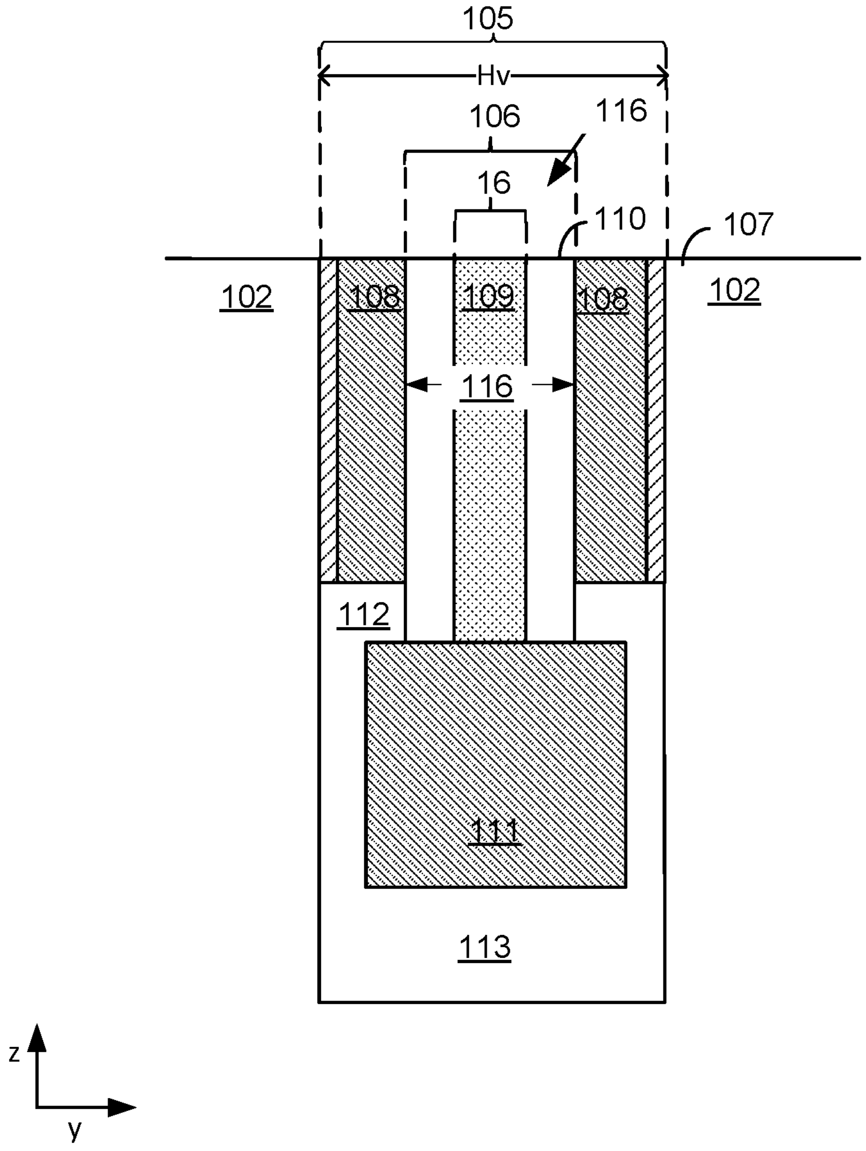
FIG. 2B is an illustration of a cross-sectional view of a portion of the device of FIG. 2A.
Figure 2C:
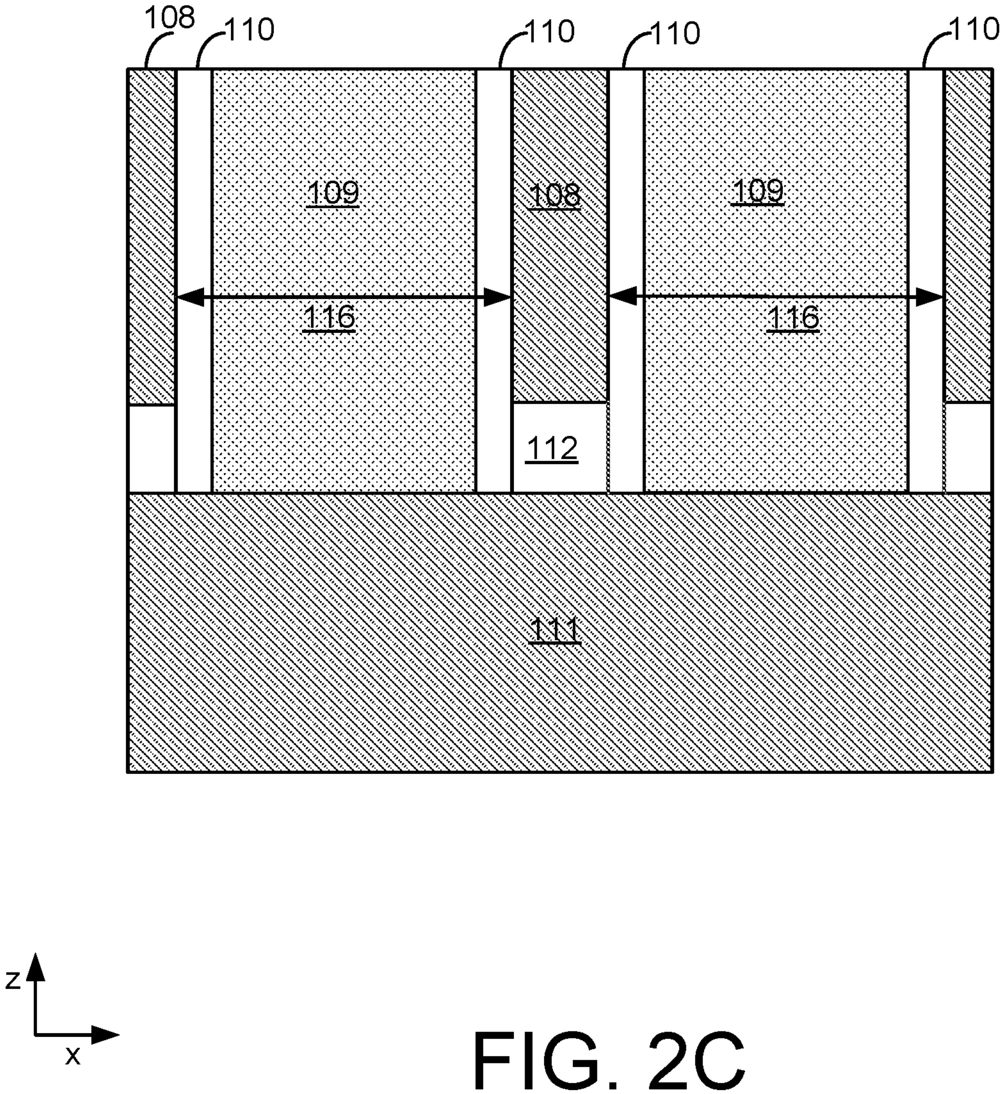
FIG. 2C is an illustration of another cross-sectional view of a portion of the device of FIG. 2A.

FIGS. 2B and 2C shows cross-sectional views of portions of device 200. FIG. 2B shows a cross-sectional view (taken along line A-A in FIG. 2A in the z-y plane) across, for example, a portion of section of a mesa 102 in an upper area 10A and a portion of the corresponding section of the mesa 102 in a lower area 10L, shield-connection trench 105 and an insulator-lined conductive-plug 116 (disposed between the mesas 102. The insulator-lined conductive-plug 116 includes a conductive central portion (e.g., conductive material 109) surrounded by a concentric insulating outer portion (e.g., oxide 110). FIG. 2B shows the insulator-lined conductive-plug 116 going through gate poly 108 and IPD 112 to reach buried shield poly layer 111 in shield-connection trench 105. Conductive material 109 (e.g., tungsten) of conductive center portion of the insulator-lined conductive-plug 116 electrically contacts the buried shield poly layer 111 in shield-connection trench 105. The buried shield poly layer 111 may be isolated from the bottom and sides of shield-connection trench 105 by a dielectric layer (e.g., an oxide layer 113).

FIG. 2C shows a cross-sectional view (taken along line B-B in FIG. 2A in the z-x plane) across, for example, along a portion of shield-connection trench 105 and two insulator-lined conductive-plugs 116. FIG. 2C shows, for example, the two insulator-lined conductive-plugs 116 going through gate poly 108 and IPD 112 to reach buried shield poly layer 111 in shield-connection trench 105. Like in FIG. 2B, each of the two insulator-lined conductive plugs 116 includes a conductive central portion (e.g., conductive material 109) surrounded by a concentric insulating outer portion (e.g., oxide 110). The conductive material 109 (e.g., tungsten) electrically contacts the buried shield poly layer 111 in shield-connection trench 105.

As previously noted, in the example implementation shown in FIG. 2A, corresponding sections of active trenches 101 (and mesas 102) extending in the y direction above and below horizontal shield-connection trench 105 are aligned with each other in the x direction and are not staggered relative to each other in the x direction). The intersection of shield-connection trench 105 with a longitudinal trench 101 with non-staggered sections may create a four-way (x-y) crossing of trenches as depicted by arrows 11 in FIG. 2A.

Figure 3:
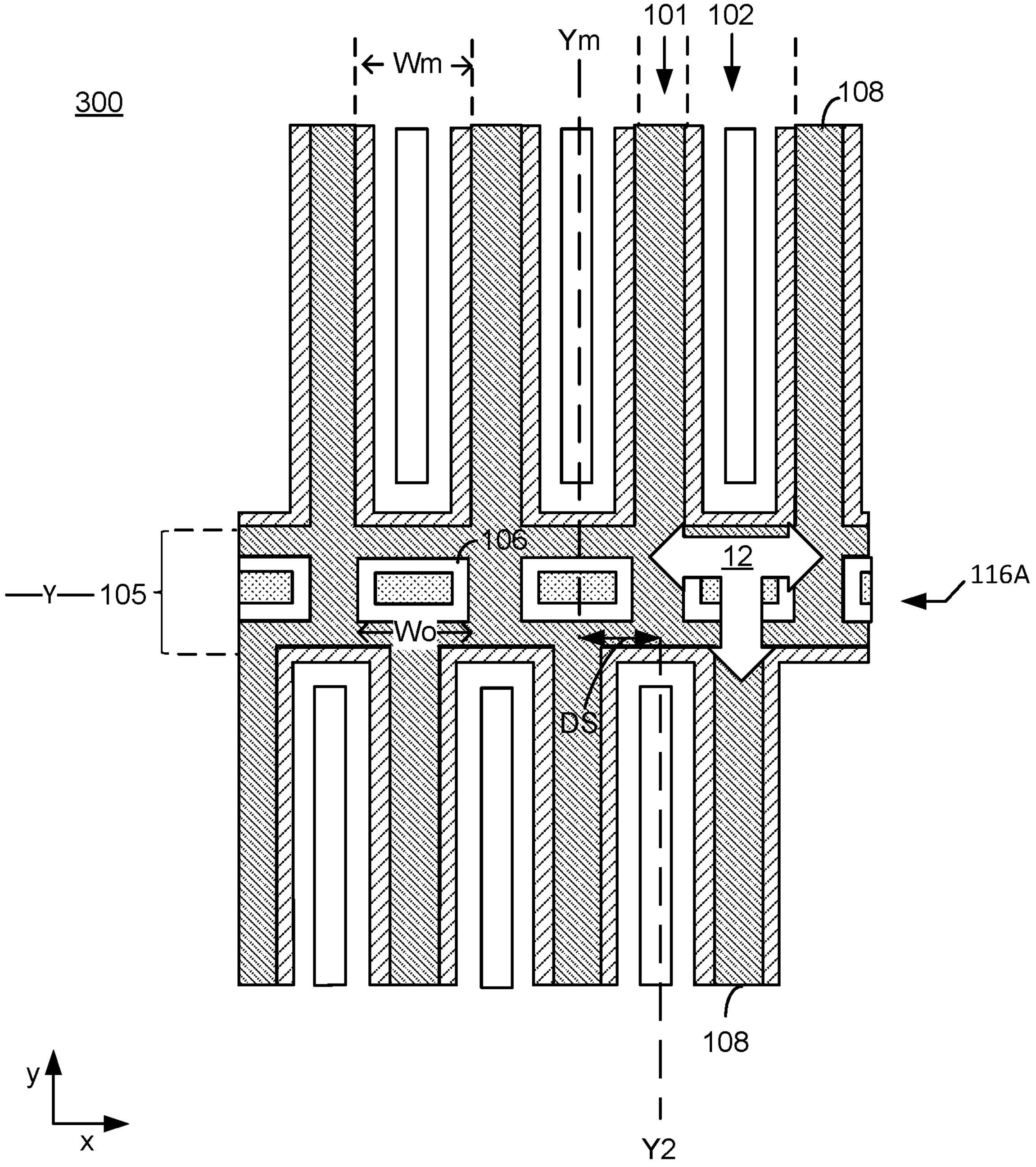
FIG. 3 illustrates another example shielded gate trench MOSFET device.
Figure 4:
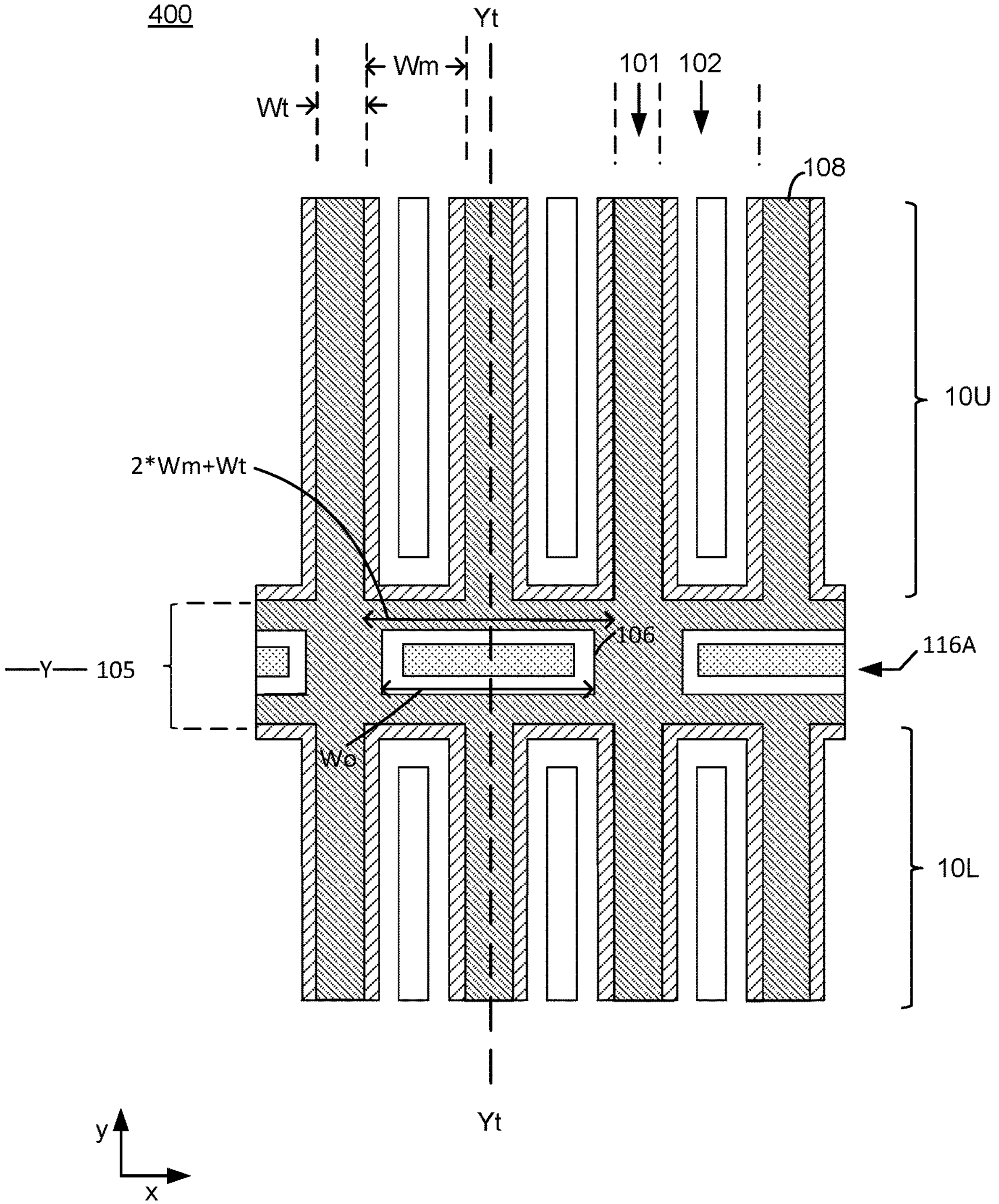
FIG. 4 is an illustration of yet another example shielded gate trench MOSFET device.
Figure 5:
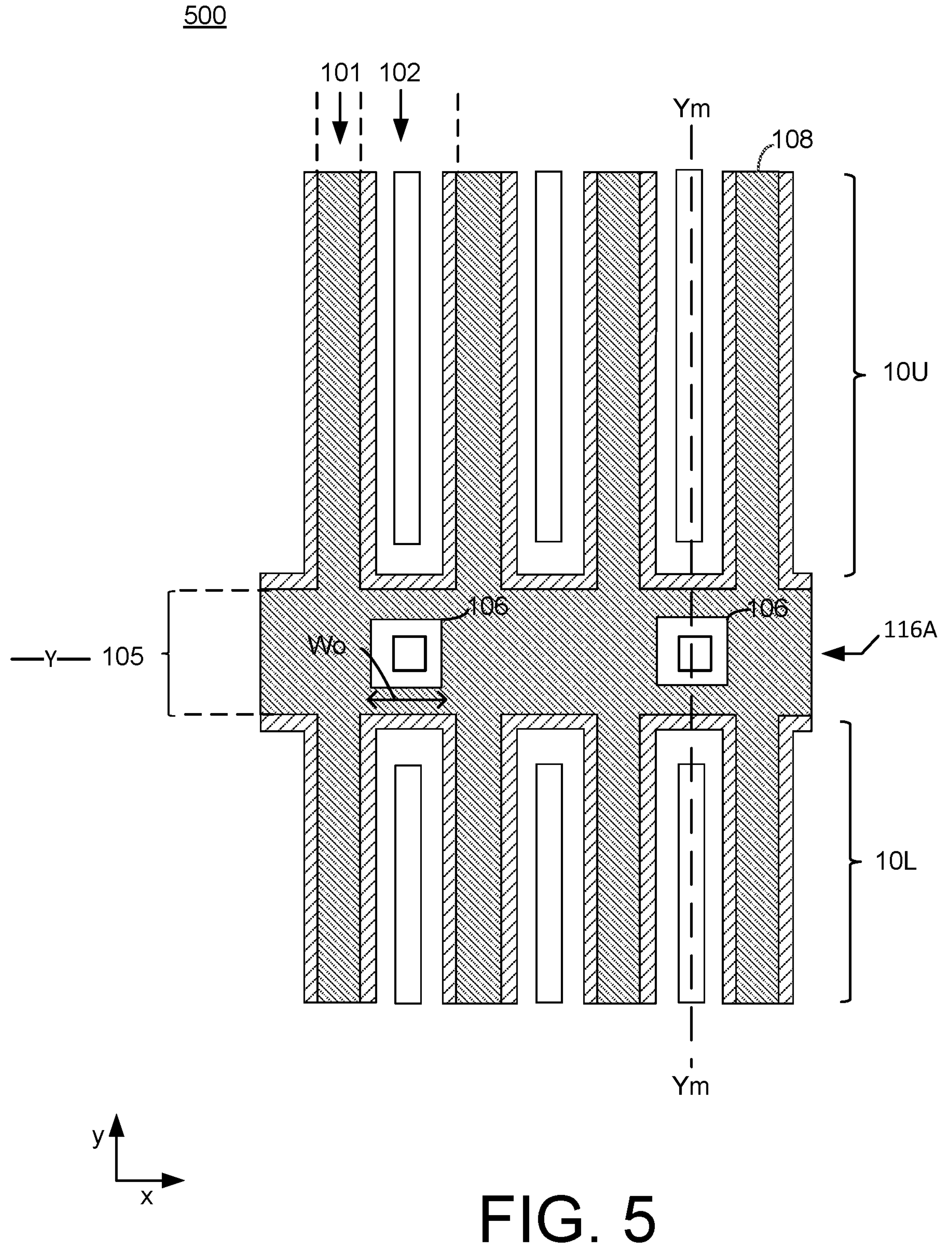
FIG. 5 is an illustration of a further example shielded gate trench MOSFET device.

FIG. 3 shows another example shielded gate trench MOSFET device 300 with gate electrodes that are continuous around and not interrupted (e.g., uninterrupted) by shield contacts made to shield poly under the gate electrodes in a horizontal shield-connection trench. In device 300, corresponding sections of active trenches 101 (and mesas 102) extending in the y direction above and below horizontal shield-connection trench 105 are staggered relative to each other in the x direction, for example, by a distance DS in the x direction. Shield-connection trench 105 may act as a termination trench for staggered sections of longitudinal trench 101 and may create a three-way (x-x-y) crossing of trenches as depicted by arrows 12 in FIG. 3. Processing three-way crossings of trenches may be preferable to processing four-way crossings (arrows 11, FIG. 2A) of trenches under some processing conditions, FIGS. 4 and 5 show other example shielded gate trench MOSFET devices (i.e., device 400 and device 500, respectively) with gate electrodes that are continuous around and not interrupted by shield contacts made to shield poly under the gate electrodes in a horizontal shield-connection trench. In device 400 and in device 500, like in device 200, corresponding sections of active trenches 101 (and mesas 102) extending in the y direction above and below horizontal shield-connection trench 105 are aligned with each other in the x direction and are not staggered relative to each other in the x direction. However, the number of vertical insulator-lined conductive-plugs 106 in shield-connection trench 105 may be less than the number of active trenches 101 (or mesas 102) intersected by shield-connection trench 105.

In example implementations, the number of vertical insulator-lined conductive-plugs 106 in shield-connection trench 105 may be equal to about one half of the number of active trenches 101 (or mesas 102) intersected by shield-connection trench 105.

In an example implementation (device 400) shown in FIG. 4, each insulator-lined conductive-plug 106 may have a width Wo (in the x direction) that is greater than Wm of a mesa 102 (e.g., Wo may be about twice as large as Wm). In an example implementation, Wo may be about equal to, or greater than, the sum of the width of a mesa 102 (Wm) and the width of a trench 101 (Wt). Further, in example implementations, as shown in FIG. 4, each insulator-lined conductive-plug 106 may be disposed in shield-connection trench 105 in a space between sections of a pair of mesas 102 in an upper area 10U and a pair of corresponding sections of the pair of mesas 102 in a lower area 10L. Each insulator-lined conductive-plug 106 may have a rectangular shape with a width Wo in the x direction and a length Lo in the y direction. In example implementations, as previously noted, width Wo may be larger than the width Wm of a mesa 102. In the example implementation shown, for example, in FIG. 4, width Wo may be about equal to the widths of two mesas (2Wm) and a width of a trench (Wt), i.e., Wo may approximately equal 2*Wm+Wt.

FIG. 5 shows another example implementation of a device with the number of vertical contact insulator-lined conductive-plugs 106 in shield-connection trench 105 equal to about one half of the number of active trenches 101 In device 500, each insulator-lined conductive-plug 106 may have a width Wo (in the x direction) that is smaller than the width Wm of a mesa 102. Further, in example implementations, as shown in FIG. 5, each insulator-lined conductive-plug 106 may be disposed in shield-connection trench 105 in a space between sections of alternating mesas 102 in an upper area 10A and corresponding sections of alternating mesas 102 in a lower area 10L. In other words, with regards to a first mesa 102, an opening insulator-lined conductive-plug may be disposed in shield-connection trench 105 in a space between a section of the first mesa 102 in an upper area 10U and a corresponding section of the first mesa 102 in lower area 10L; however, with regards to a second (neighboring) mesa 102, no insulator-lined conductive-plug 106 is disposed between the upper and lower sections of the second mesa 102.

In the examples shown in FIGS. 1 through 5, the longitudinal active trenches and mesas (e.g., trenches 101 and mesas 102) extend longitudinally (e.g., along the y axis or y direction) from a gate contact area (gate feed). The longitudinal active trenches and mesas may, for example, extend between two gate feeds (e.g., gate metal 710-1 and gate metal 710-2, FIGS. 6-8). The plurality of longitudinal active trenches and mesas may, for example be perpendicularly traversed by a single horizontal shield connection trench 105 and a single linear array of insulator-lined conductive-plug s (e.g., array 106A) disposed in shield connection trench 105 is used to make shield contacts to the shield poly in the device.

FIGS. 6, 7, 8 and 9 show other example implementations in which the longitudinal active trenches and mesas (e.g., trenches 101 and mesas 102) between two gate feeds (e.g., gate metal 710-1 and 710-2, FIGS. 6-8) are perpendicularly traversed by more than one horizontal shield-connection trench and more than one linear array of insulator-lined conductive-plugs (e.g., array 106A) can be used to make shield contacts to the shield poly in the horizontal shield-connection trenches in the device.

Figure 6:
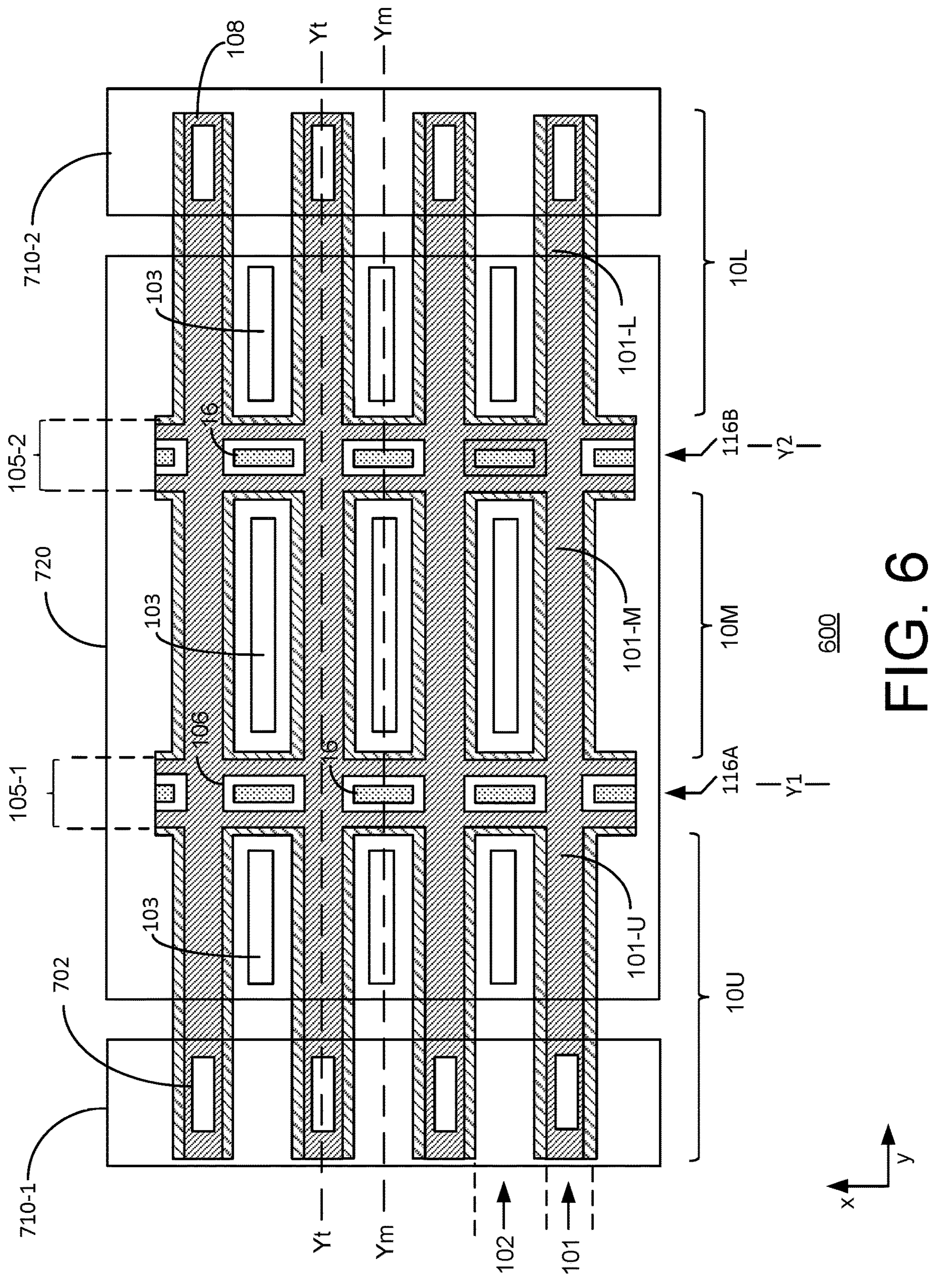
FIG. 6 is an illustration of still another example shielded gate trench MOSFET device.

FIG. 6 shows another example shielded gate trench MOSFET device 600 with gate electrodes that are continuous around and are not interrupted by the shield contacts made to shield poly under the gate electrodes. In the example shown in FIG. 6, device 600 includes active trenches 101 and mesas 102 of a first direction type extending in parallel in a longitudinal direction (e.g., along the y direction) between two gate feeds. The two gate feeds are formed by two sheets or strips of gate metal (e.g., gate metal 710-1 and gate metal 710-2) connected to gate electrode contacts (e.g., contacts 702) in end regions of the active trenches 101.

A first horizontal shield-connection trench 105-1 (side trench) of a second direction type extends laterally in a transverse direction (e.g., along an x direction) and intersects trenches 101 and mesas 102 at about a location Y1 on the y axis. A second horizontal shield-connection trench 105-1 (side trench) of the second direction type extends laterally in the transverse direction (e.g., along the x direction) orthogonal to the longitudinal direction, and intersects trenches 101 and mesas 102 at about a location Y2 on the y axis. Shield-connection trenches 105-1 and 105-2 may effectively split each longitudinal trench 101 and each mesa 102 into three sections (e.g., with first section of a longitudinal trench 101 in a first area (e.g., upper area 10U) on a side of shield-connection trench 105-1 (away from a side closer to shield-connection trench 105-2 in the y direction), a second section of the longitudinal trench 101 in a second area (e.g., middle area 10M) between shield-connection trenches 105-1 and 105-2 in the y direction, and a third section of trench 101 in a third area (e.g., lower area 10L) on a side of shield-connection trench 105-2 (away from a side closer to shield-connection trench 105-1 in the y direction). Source contact regions 103 on mesas 102 in all three areas may, for example, contacted by source metal 720.

Sections of trenches 101 and mesas 102 and corresponding sections of active trenches 101 (and mesas 102) extending in the y direction above (e.g., in upper area 10U), between (e.g., in middle area 10M), and below (e.g., in lower area 10L) the horizontal shield-connection trench 105-1 and 105-2 may be aligned with each other in the x direction (in other words a first section of trench 101 above horizontal shield connection trench 105-1, a second section of trench 101 between horizontal shield connection trenches 105-1 and 105-2, and a third section of a corresponding trench 101 below horizontal shield connection trench 105-2 may share a common y axis (e.g., axis Yt) and not be staggered relative to each other in the x direction). FIG. 6 shows, for example, a trench section 101-U of a trench 101 above horizontal shield-connection trench 105-1, a trench section 101-M of the trench 101 between horizontal shield-connection trenches 105-1 and 105-2 and a trench section 101-L of the trench 101 below horizontal shield-connection trench 105-2 that are all aligned on a common y axis (i.e., Yt). Similarly, neighboring sections of a mesa 102 above, between, and below horizontal shield-connection trench 105-1 and 105-2 are all aligned on a common y axis (i.e., Ym). In device 600, like in devices 200, corresponding sections of active trenches 101 (and mesas 102) extending in the y direction above (e.g., trench section 10-U), between (e.g., trench section 10-M), and below (e.g., trench section 10-L) horizontal shield-connection trenches 105-1 and 105-2 are aligned with each other in the x direction and are not staggered relative to each other in the x direction.

In example implementations, both horizontal shield-connection trench 105-1 and 105-2 may be used as areas to contact the shield poly buried under gate poly in the device. For example, an array 116A of insulator-lined conductive-plugs 116 may be disposed in trench 105-1 and an array 116B of insulator-lined conductive-plugs 116 may be disposed in trench 105-2 for making the shield poly contacts. Having two horizontal shield-connection trench 105-1 and 105-2 may increase the number of shield contacts that can be made compared to the number of shield contacts that can be made in the device using only a single shield-connection trench. In example implementations, source metal 720 may be used to connect to the shield contacts formed in the two horizontal shield-connection trench 105-1 and 105-2.

In example implementations, as previously described above with reference to device 200 (FIGS. 2A-2C), in device 600, gate poly deposited in shield-connection trenches 105-1 and 105-2 along a side of, or around, an insulator-lined conductive-plug 116 may provide structural and electrical continuity of the gate electrodes in trenches 101 across shield-connection trench 105-1 and 105-2.

As described previously with reference to device 200, the buried shield poly layer in device 600 may be contacted by arrays (116A and 116B) of vertical insulator-lined conductive-plugs 116 made through a layer of gate poly 108 (FIG. 2A) in shield-connection trenches 105-1 and 105-2. Each insulator-lined conductive-plug 116 may be lined with an insulator (e.g., oxide 110, FIG. 2A) to form an inner opening 16. Inner opening 16 may be filled with conductive material (e.g., conductive material 109, FIGS. 2A-2C) to contact the shield poly buried under the gate poly 108 in device 600. Gate poly 108 disposed along and around the vertical contact insulator-lined conductive-plugs 116 maintains electrical continuity of the gate electrodes formed in active trenches 101 across shield-connection trench 105-1 and 105-2 in device 600.

As noted above with reference to FIG. 6, in device 600, corresponding sections of active trenches 101 (and mesas 102) extending in the y direction above (e.g., trench section 10-U), between (e.g., trench section 10-M), and below (e.g., trench section 10-L) horizontal shield-connection trenches 105-1 and 105-2 are aligned with each other in the x direction and are not staggered relative to each other in the x direction.

Figure 7:
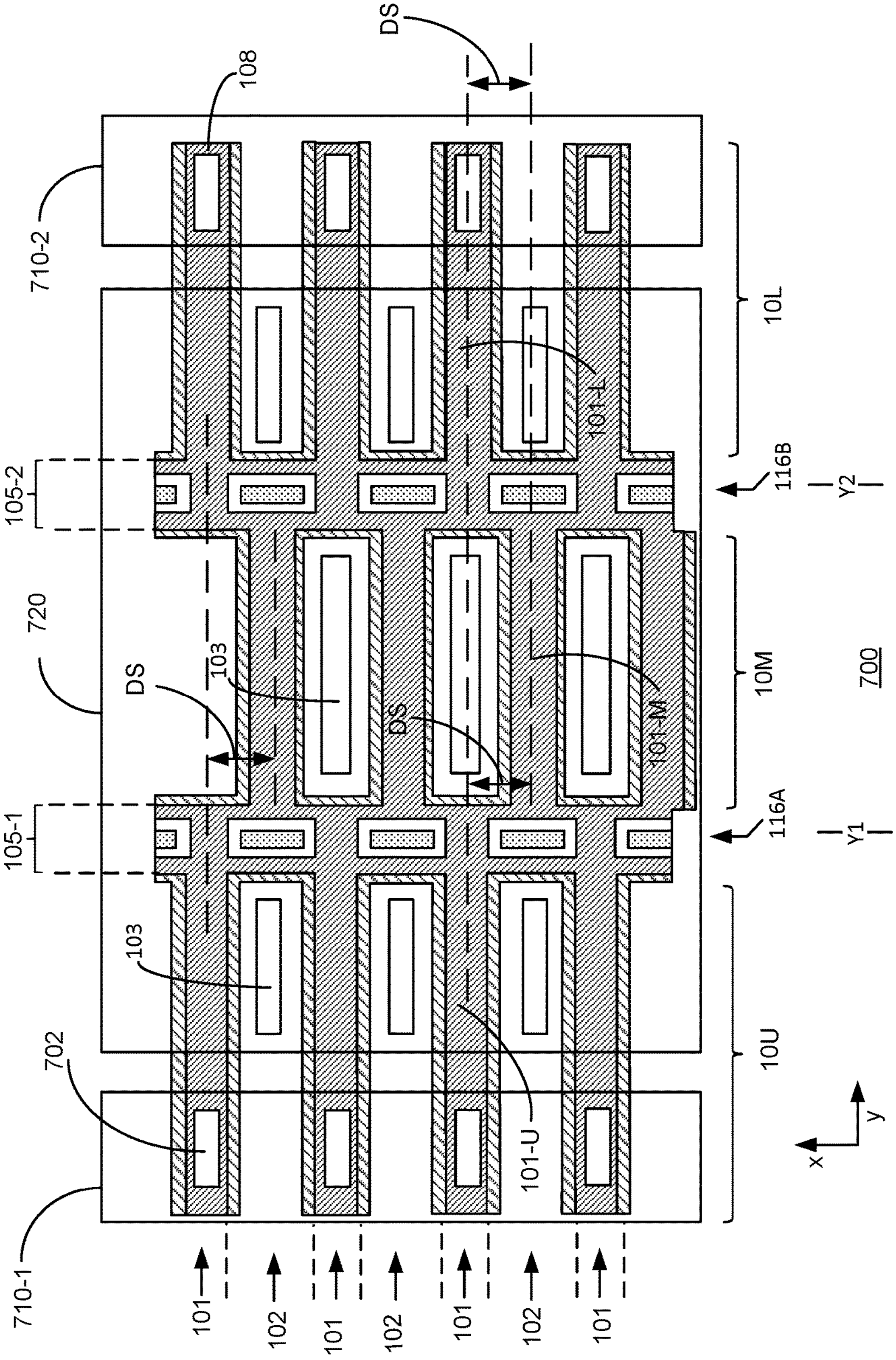
FIG. 7 is an illustration of an additional example shielded gate trench MOSFET device.

FIG. 7 shows an example shielded gate trench MOSFET device 700, which like device 600, has two shield-connection trenches 105-1 and 105-2 perpendicularly intersecting active trenches 101 and mesas 102. However, in device 700, unlike device 600, the two shield-connection trenches 105-1 and 105-2 are configured as termination trenches for sections of active trenches 101. Further, sections (e.g., trench section 10-M) of active trenches 101 (and mesas 102) extending in the y direction between the two horizontal shield-connection trenches 105-1 and 105-2 are staggered in the x direction relative to the trench sections (e.g., trench sections 10-U and 10-L) above and below the two horizontal shield-connection trenches 105-1 and 105-2. In FIG. 7, a stagger distance between the different trench sections is indicated as distance DS in the x direction. In other words, a middle section longitudinal trench (e.g., trench 101-M in trench section 10-M) is offset by a stagger distance DS parallel to the first and second lateral trenches (e.g., the horizontal shield-connection trenches 105-1 and 105-2) relative to first section and second section longitudinal trenches (e.g., trenches 101-U and 101-L). Staggering the active trenches sections avoids having to process large (4-way) trench intersections.

In example implementations, the horizontal trenches (e.g., shield-connection trench 105) that is used to intercept and traverse (i.e., cut across) trenches 101 and mesas 102 to create an area for making shield poly contacts may include multiple short length, discontinuous trench segments that each traverse only a small number of trenches 101 and mesas 102 (e.g., two to five trenches 101). Further, these short length, horizontal trench segments may traverse the small number of trenches 101 at different locations in a device layout.

Figure 8:
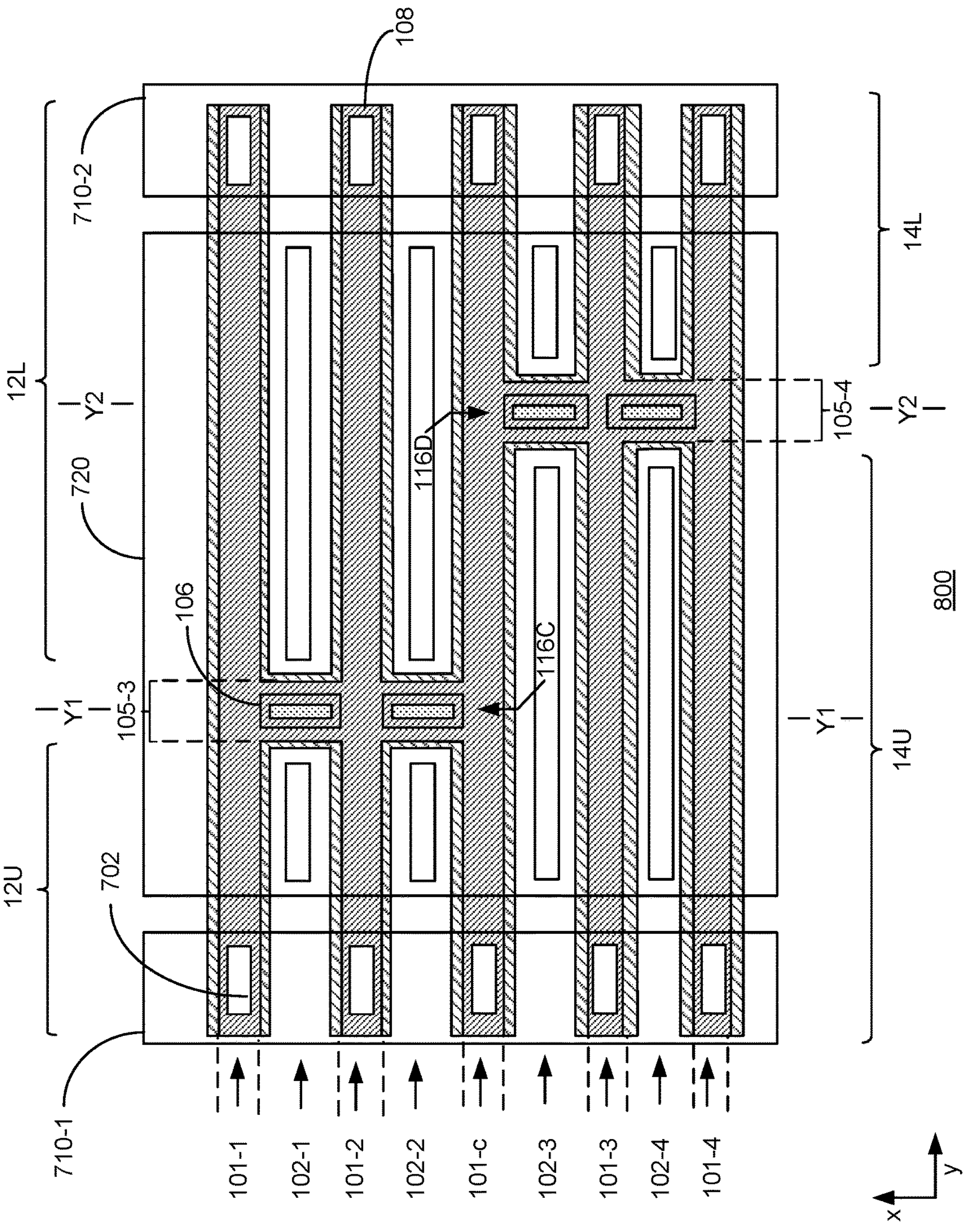
FIG. 8 is an illustration of yet another additional example shielded gate trench MOSFET device.

FIG. 8 shows an example shielded gate trench MOSFET device 800 in which short length horizontal trench segments perpendicularly intersect and traverse a small number of active trenches to create a side area for making shield poly contacts.

Device 800, like devices 600 and 700, may include active trenches 101 and mesas 102 running in the y direction between two gate feeds. The two gate feeds are formed by two sheets or strips of gate metal (e.g., gate metal 710-1 and gate metal 710-2) connected to gate electrode contacts (e.g., contacts 702) in end regions of the active trenches 101.

A first short length shield-connection trench 105-3 extends laterally (e.g., in a x direction) across trenches 101-1, 101-2, and 101-*c* (and mesas 102-1 and 102-2) at about a location Y1 on the y axis. A second short length shield-connection trench 105-4 extends laterally (e.g., in a x direction) across trenches 101-*c*, 101-3, and 101-4 (and mesas 102-3 and 102-3) at about a location Y2 on the y axis.

As shown in FIG. 8, short length shield-connection trench 105-3 effectively splits each longitudinal trench 101-1 and 101-2, and each mesa 102-1 and 102-2 into two sections (e.g., with an upper section in an upper area (e.g., area 12U) above shield-connection trench 105-3 in the y direction, and a lower section in a lower area (e.g., area 12L) below shield-connection trench 105-3 in the y direction). Short length shield-connection trench 105-4 effectively splits each longitudinal trench 101-3 and 101-4, and each mesa 102-3 and 102-4 into two sections (e.g., with an upper section in an upper area (e.g., area 14U) above shield-connection trench 105-4 in the y direction, and a lower section in a lower area (e.g., area 14L) below shield-connection trench 105-4 in the y direction).

Short-length shield-connection trenches 105-3 and 105-4 because of their limited length or area can accommodate only a limited number of insulator-lined conductive-plugs 116 for making shield poly contacts in device 800. For example, array 116C and array 116D each comprising of two insulator-lined conductive-plugs 116 may be disposed in short-length shield-connection trenches 105-3 and 105-4, respectively. However, the diversity in locations where the short-length shield connection trenches 105-3 and 105-4 can be used (e.g., locations Y1 and Y2) and the consequent diversity in locations of insulator-lined conductive-plugs 116 for making the shield poly contacts may result in device design flexibility and processing robustness.

In an example implementation, a MOSFET device includes a set of longitudinal trenches and longitudinal mesas extending longitudinally across a semiconductor substrate from a gate feed. The device further includes a first lateral trench perpendicularly intersecting at least one of the set of longitudinal trenches and longitudinal mesas at a first distance from the gate feed, the first lateral trench being in fluid communication with the intersected at least one of the set of longitudinal trenches, and a second lateral trench perpendicularly intersecting at least one of the set of longitudinal trenches and longitudinal mesas within the semiconductor substrate at a second distance from the gate feed, the second lateral trench being in fluid communication with the intersected at least one of the set of longitudinal trenches.

In the MOSFET device, a shield poly layer is disposed in the set of longitudinal trenches and the first and second lateral trenches. An inter-poly dielectric layer (IPD) and a gate poly layer disposed above the shield poly layer in the set of longitudinal trenches and the lateral trench.

Further, in the MOSFET device, a first electrical contact to the shield poly layer is made by a first insulator-lined conductive-plug passing through the inter-poly dielectric layer and the gate poly layer disposed in the first lateral trench, and second electrical contact to the shield poly layer is made by a second insulator-lined conductive-plug passing through the inter-poly dielectric layer and the gate poly layer disposed in the second lateral trench.

In the MOSFET device, the gate poly disposed in at least one of the set of longitudinal trenches intersected by the first lateral trench forms a continuous gate electrode of the device uninterrupted by the electrical contact to the shield poly layer made by the first insulator-lined conductive-plug passing through in the inter-poly dielectric layer and the gate poly layer disposed in the first lateral trench. The gate poly disposed in at least one of the set of longitudinal trenches intersected by the second lateral trench also forms a continuous gate electrode of the device uninterrupted by the electrical contact to the shield poly layer made by the first insulator-lined conductive-plug passing through the inter-poly dielectric layer and the gate poly layer disposed in the second lateral trench.

In some example implementations of the MOSFET device, the at least one of the set of longitudinal trenches intersected at the first distance by the first lateral trench is a different one of the set of longitudinal trenches than the at least one longitudinal trench intersected at the second distance by the second lateral trench.

In some example implementations of the MOSFET device, the at least one of the set of longitudinal trenches intersected at the first distance by the first lateral trench is a same one of the set of longitudinal trenches intersected at the second distance by the second lateral trench.

In some example implementations of the MOSFET device, the at least one of the set of longitudinal trenches intersected at the first distance by the first lateral trench and intersected at the second distance by the second lateral trench are split into a first section longitudinal trench on a side of the first lateral section, a middle section longitudinal trench between the first and second lateral trenches, and a third section longitudinal trench on a side the second lateral trench. In some example implementations of the device, the middle section longitudinal trench is offset by a stagger distance parallel to the first and second lateral trenches relative to first section and second section longitudinal trenches.

Figure 9:
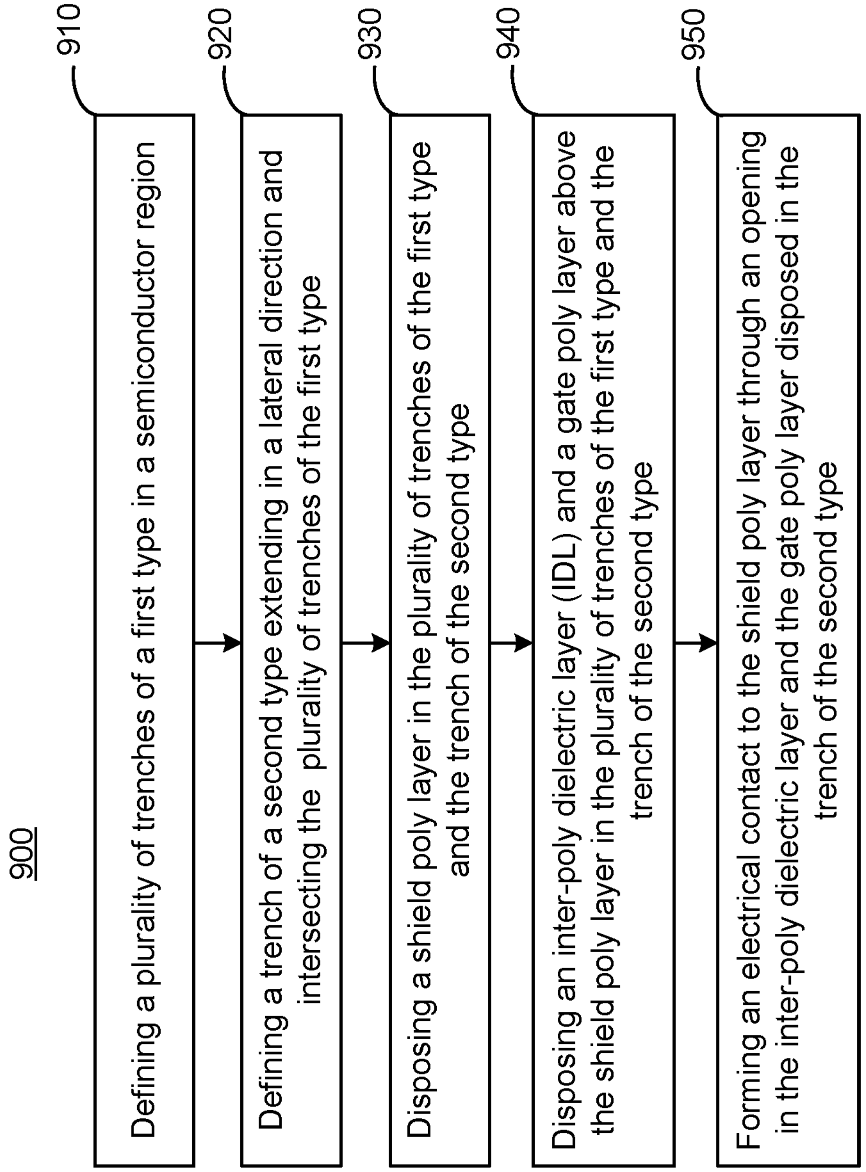
FIG. 9 is an illustration of an example method.

FIG. 9 shows an example method 900 for reducing shield electrode resistance in a shielded gate trench MOSFET device.

Method 900 includes defining a plurality of trenches of a first type in a semiconductor substrate (910). The plurality of trenches of the first type extend in a longitudinal direction (e.g., from a gate feed region). Method 900 further includes defining a trench of a second type extending in a lateral direction and intersecting the plurality of trenches of the first type (920), The trench of the second type is in fluid communication with each of the intersected plurality of trenches of the first type. Method 900 further includes disposing a shield poly layer in the plurality of trenches of the first type and the trench of the second type (930), disposing an inter-poly dielectric layer (IPL) and a gate poly layer above the shield poly layer in the plurality of trenches of the first type and the trench of the second type (940), and forming an electrical contact to the shield poly layer through an opening in the inter-poly dielectric layer and the gate poly layer disposed in the trench of the second type (950).

In method 900, forming the electrical contact to the shield poly layer through the opening includes lining the opening with an insulator (e.g., an oxide) and disposing one of a metal (e.g., tungsten), a metal alloy, a metal silicide, or conductive polysilicon in the opening.

A method includes: defining a plurality of trenches of a first type in a semiconductor substrate, the plurality of trenches of the first type extending in a longitudinal direction; defining a trench of a second type extending in a lateral direction and intersecting the plurality of trenches of the first type, the trench of the second type being in fluid communication with each of the intersected plurality of trenches of the first type; disposing a shield poly layer in the plurality of trenches of the first type and the trench of the second type; disposing an inter-poly dielectric layer (IPL) and a gate poly layer above the shield poly layer in the plurality of trenches of the first type and the trench of the second type; and forming an electrical contact to the shield poly layer through an opening in the inter-poly dielectric layer and the gate poly layer disposed in the trench of the second type.

In the foregoing method, forming the electrical contact to the shield poly layer through the opening includes lining the opening with an insulator.

In the foregoing method, forming the electrical contact to the shield poly layer through the opening includes disposing one of a metal, a metal alloy, a metal silicide, or conductive polysilicon in the opening.

In the foregoing method, forming the electrical contact to the shield poly layer through the opening includes disposing tungsten in the opening.

Specific structural and functional details disclosed herein are merely representative for purposes of describing example embodiments. Example embodiments, however, may be embodied in many alternate forms and should not be construed as limited to only the embodiments set forth herein.

It will be understood that the specific numbers and geometric sizes and distributions of the electrical contacts in shield-connection trench are not limited to those shown in the drawings herein.

For example, the representative embodiments illustrated in the drawings herein may include specific numbers, and geometric sizes and alignments, of the electrical contacts (e.g., by insulator-lined conductive-plug 116) in a shield-connection trench. The representative embodiments illustrated in the drawings show, for example, one electrical contact in a shield-connection trench for every mesa or for every two mesas, electrical contacts that have widths comparable to the widths of one mesa or the widths of two mesas, and electrical contacts that are generally aligned geometrically with the mesas, etc. Other embodiments within the scope of this disclosure need not be limited to the representative examples shown in the figures herein. The other embodiments may, for example, include electrical contacts that are aligned with the inter-mesa trenches, or partly aligned to a mesa and an inter-mesa trench, or randomly positioned in the shield-connection trench without regard to alignment with the mesas or the inter-mesa trenches. The other embodiments may, for example, include an electrical contact of any width that need not be an integer multiple or integer fraction of a mesa width (or an inter-mesa trench width). Similarly, the other embodiments may, for example, include a number of contacts in the shield-connection trench that is not an integer multiple or integer fraction of the number of mesas (or inter-mesa trenches).

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A device comprising:

a plurality of trenches including:

a first trench in a semiconductor substrate extending in a longitudinal direction;

a second trench parallel to the first trench in the semiconductor substrate; and a third trench extending in a transverse direction and intersecting the first trench and the second trench, the longitudinal direction being orthogonal to the transverse direction, the third trench separating a first rectangular mesa that is axially aligned with a second rectangular mesa;

a shield poly layer disposed in the plurality of trenches;

an inter-poly dielectric layer and a gate poly layer disposed above the shield poly layer; and an electrical contact to the shield poly layer disposed within an opening in the inter-poly dielectric layer and the gate poly layer disposed in the third trench, the opening being disposed between the first rectangular mesa and the second rectangular mesa.

2. The device of claim 1, wherein the electrical contact to the shield poly layer disposed within an opening in the inter-poly dielectric layer and the gate poly layer is an insulator-lined conductive plug.

3. The device of claim 2, wherein the insulator-lined conductive plug is an oxide-lined conductive plug.

4. The device of claim 2, wherein a conductive central portion of the insulator-lined conductive plug includes one of a metal, a metal alloy, or a metal silicide.

5. The device of claim 2, wherein a central portion of the insulator-lined conductive plug includes conductive polysilicon.

6. The device of claim 1, wherein the gate poly layer disposed in the first trench and the gate poly layer disposed in the second trench each form a continuous gate electrode of the device uninterrupted by the electrical contact to the shield poly layer disposed within the opening in the inter-poly dielectric layer and the gate poly layer disposed in the second trench.

7. The device of claim 1, wherein the opening is surrounded laterally by the gate poly layer.

8. The device of claim 7, wherein the first rectangular mesa, the opening, and the second rectangular mesa are aligned along a common longitudinal axis.

9. A device comprising:

a plurality of longitudinal trenches and a plurality of longitudinal mesas extending in parallel in a longitudinal direction across a semiconductor substrate;

a lateral trench extending in a transverse direction orthogonal to the longitudinal direction and intersecting the plurality of longitudinal trenches and the plurality of longitudinal mesas, the lateral trench splitting the plurality of longitudinal mesas into a plurality of first rectangular mesas on a first side of the lateral trench and a plurality of second rectangular mesas on a second side opposite the first side of the lateral trench;

a shield poly layer disposed in the plurality of longitudinal trenches and the lateral trench;

an inter-poly dielectric layer and a gate poly layer disposed above the shield poly layer in the plurality of longitudinal trenches and the lateral trench; and an electrical contact to the shield poly layer by at least one insulator-lined conductive-plug extending through the inter-poly dielectric layer and the gate poly layer disposed in the lateral trench, the at least one insulator-lined conductive-plug being surrounded laterally by the gate poly layer.

10. The device of claim 9, wherein the at least one insulator-lined conductive-plug, a first rectangular mesa, and a second rectangular mesa are aligned along a common longitudinal axis perpendicular to the lateral trench.

11. The device of claim 9, wherein each of the plurality of longitudinal mesas have a mesa width, and wherein the at least one insulator-lined conductive-plug has a width that is a same as, or smaller than, the mesa width.

12. The device of claim 9, wherein each of the plurality of longitudinal trenches has a trench width and each of the plurality of longitudinal mesas has a mesa width, and wherein conductive material in a central portion of the at least one insulator-lined conductive-plug has a width in the transverse direction that is larger than the mesa width.

13. The device of claim 12, wherein the at least one insulator-lined conductive-plug has a width that is about equal to a sum of two mesa widths and a trench width.

14. The device of claim 9, wherein the at least one insulator-lined conductive-plug includes a number of insulator-lined conductive-plugs disposed in the lateral trench, the number of insulator-lined conductive-plugs being about a same as a number of longitudinal trenches in the plurality of longitudinal trenches.

15. The device of claim 9, wherein the at least one insulator-lined conductive-plug includes a number of insulator-lined conductive-plugs disposed in the lateral trench, the number of insulator-lined conductive-plugs being about one half of a number of longitudinal trenches in the plurality of longitudinal trenches.

16. The device of claim 9, wherein the lateral trench defines respective short sides of the plurality of first rectangular mesas and the plurality of second rectangular mesas; and wherein the at least one insulator-lined conductive-plug disposed in the lateral trench is disposed in a space between a short side of a first rectangular mesa and a short side of a second rectangular mesa.

17. The device of claim 9, wherein the at least one insulator-lined conductive-plug in the inter-poly dielectric layer and the gate poly layer is an oxide-lined opening.

18. The device of claim 9, wherein the electrical contact to the shield poly layer through the at least one insulator-lined conductive-plug includes one of a metal, a metal alloy, or a metal silicide.

19. The device of claim 9, wherein the electrical contact to the shield poly layer through the at least one insulator-lined conductive-plug includes tungsten.

20. The device of claim 9, wherein the gate poly layer disposed in the plurality of longitudinal trenches and the lateral trench forms a continuous gate electrode of the device uninterrupted by the electrical contact to the shield poly layer by the at least one insulator-lined conductive-plug through the inter-poly dielectric layer and the gate poly layer disposed in the lateral trench.

21. A device comprising:

a plurality of trenches in a semiconductor substrate, the plurality of trenches defining a first rectangular mesa and a second rectangular mesa each having a long side and a short side, the short side of the first rectangular mesa facing the short side of the second rectangular mesa;

a gate poly layer disposed in the plurality of trenches;

a shield poly layer buried under and isolated from the gate poly layer in the plurality of trenches; and a shield poly contact extending through an opening in the gate poly layer to the shield poly layer, the shield poly contact being insulated from the gate poly layer, the opening located between the short side of the first rectangular mesa and the short side of the second rectangular mesa.

22. The device of claim 21, wherein the shield poly contact is one of a plurality of shield poly contacts disposed within a same trench, the plurality of shield poly contacts extending through respective openings in the gate poly layer to the shield poly layer.

23. The device of claim 21, wherein the opening is surrounded laterally by the gate poly layer.

* * * * *